TRANSISTOR OSCILLATOR HAVING VOLTAGE DEPENDENT RESISTOR FOR FREQUENCY STABILIZATION

Filed Feb. 26, 1962

INVENTOR
EWALD SCHLEENBECKER
BY
AGENT

United States Patent Office 3,199,050
Patented Aug. 3, 1965

3,199,050
TRANSISTOR OSCILLATOR HAVING VOLTAGE DEPENDENT RESISTOR FOR FREQUENCY STABILIZATION

Ewald Schleenbecker, Fellinghausen, Germany, assignor to North American Philips Company, Inc., New York, N.Y., a corporation of Delaware Filed Feb. 26, 1962, Ser. No. 175,531
Claims priority, application Germany, Mar. 13, 1961, P 26,748
7 Claims. (Cl. 331—109)

Figure 1:
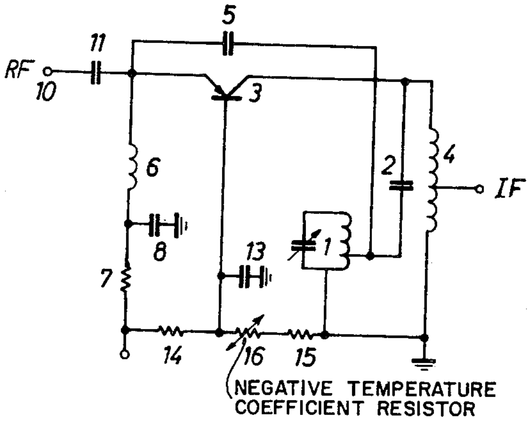

Transistor oscillators are frequently energized by batteries having terminal voltages which vary considerably during their life-time. When the voltage is supplied by a battery, such as a storage battery, which also energizes other consuming apparatus and, in addition, which is recharged with varying current intensity, voltage fluctuations of 50% between the minimum voltage and the maximum voltage must be considered. The frequency of an oscillator, however, must be fairly constant. This stability is particularly necessary in receiver oscillators, especially for the reception of oscillations of fairly high frequencies, for example in the short-wave band or the ultrashort-wave band.

Stabilization of the supply voltage, at least for the oscillator stage, in order to solve this problem is known. This involves, however, considerable costs and difficulties arise in the stabilization of the low voltages required for transistor circuits, since effective stabilizers for low voltages are expensive. With such a voltage stabilization a considerable part of the energy is dissipated.

With a transistor oscillator an excellent stabilization of the frequency with respect to supply voltage fluctuations in a large range is obtained at surprisingly low costs, if in accordance with the invention, the base voltage of the transistor is derived from the supply voltage by way of a resistor having a value which varies with the supplied voltage, so that a variation in the base bias voltage and hence a variation of the working point of the transistor is obtained. As a result of this arrangement, the frequency of the produced oscillations remains at least substantially constant.

The invention is based on the recognition of the fact that variations in the absolute value of the voltages operating at the transistor or in the currents passing through it do not have the same effect on the frequency obtained, but opposite effects are produced. It has been found, for example, that with a constant collector current, doubling of the collector voltage produced a shift of the oscillator frequency from 100 to 101 mc./s., whereas with a constant collector voltage, doubling of the collector current produced a variation of the frequency obtained from 100 to 99 mc./s. It is therefore possible by a suitable choice of the relationship between the separate operational magnitudes of a transistor oscillator to maintain the frequency of the oscillator very accurately constant. It appears that this does not require for example the transistor working point to be maintained constant on fixed current and voltage values, but that for example the collector voltage may be allowed to rise considerably with an increasing supply voltage. This is advantageous, since as a result of the transistor properties which are frequently more effective with higher voltages can be utilized, so that only with a low supply voltage the function may be affected adversely.

Figure 2:
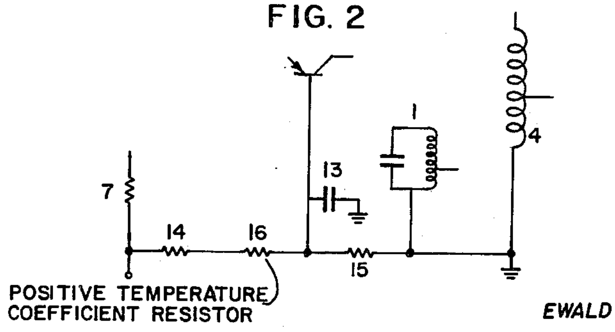

The invention will now be described by way of example with reference to the drawing, in which:

FIG. 1 is a circuit diagram of a transistor self-oscillating mixer stage for very high frequencies, according to one embodiment of the invention; and FIG. 2 is a circuit diagram of a portion of a modification of the mixer stage of FIG. 1.

A resonant circuit 1, which can be tuned to the oscillator oscillations, is connected to ground at one point. A tap on the inductor of this circuit, which may be 0.1 μh., is connected to a capacitor 2 of, for example, 68 pf. The other end of the capacitor 2 is connected to a collector of a transistor 3. The collector is also connected to the ground-connected negative terminal of the supply source by way of inductor 4, which may be 3 μh. and which is tuned, together with the capacitor 2 and the stray capacities, to the intermediate frequency oscillations. These oscillations may be coupled inductively or by way of a tap on the inductor 4 to an output terminal IF.

The tap of the resonant circuit 1 is connected by way of a capacitor 5 of, for example, 3 pf., to the emitter of the transistor 3, so that the required feedback for the oscillations of the oscillator is established. This emitter is connected by way of an inductor 6 and an emitter resistor 7 of, for example, 800 ohms, to the positive terminal of the supply source. The resistor 7 is shunted by a capacitor 8 of, for example, 1 nf. to earth. The high-frequency input oscillations mixed in the oscillator 3 with the locally produced oscillations can be supplied from a terminal 10 by way of a coupling capacitor 11.

The base of the transistor 3 is connected to ground by way of a capacitor 13 of, for example, 10 nf. for the alternating currents and receives its bias voltage from a voltage divider consisting of resistors 14, 15 and 16, connected in series between the positive terminal and the negative terminal of the supply source. The supply source may be a storage battery the voltage of which amounts normally to about 6 v. and may fluctuate in operation between 4.5 and 9 v. The resistors 14 and 15 may have a value of 4.3K ohms and 6.2K ohms respectively. The resistor 16 must have, in accordance with the invention, a non-linear characteristic curve so that the desired control of the working point of the transistor is obtained for stabilization of the oscillator frequency against supply voltage fluctuations.

With a circuit arrangement having the values mentioned above and using a transistor 3 of the type OC 171, the desired compensation was obtained, when the value of the resistors 15 and 16 varied from 10,000 ohms to about 8,000 ohms between a battery voltage variation from 4.5 v. to 9 v.

The resistor 16 may be a circuit element of any kind, which has the required values. For example, a thermistor with negative temperature coefficient may be employed. It is particularly advantageous to use a voltage-dependent resistor, known commercially as a VDR-resistor. Such resistors have the property of instantaneous variation of their resistance value, whereas thermistors, owing to their thermal inertia, respond more slowly. However, a rapid variation of the resistance value is desired particularly when voltage is supplied from a source having other loads in addition, since owing to abrupt load variations rapid voltage variations may occur, which would have an immediate effect on the oscillator frequency, if the compensation arrangement cannot instantaneously respond.

Assuming that the supply voltage initially has a value intermediate its extremes, the voltage divider will provide a determinable potential at the base electrode with respect to the emitter and collector. Consequently, the collector current and voltage will assume determinable values. If the supply voltage increases, the collector reverse bias will increase, the emitter forward bias will increase, and hence the collector current will also increase. As stated above, increases in collector voltage and current produce opposite shifts in the oscillation frequency. By proper selection of the non-linear characteristics of resistor 16, the increase in frequency which would have resulted from the increase in collector voltage may be made equal to the decrease in frequency which would have resulted from the increase in collector current. Consequently, the frequency of the oscillator may be stabilized for changes in supply voltage by employing a non-linear voltage divider in the base circuit so that the ratio of emitter-base voltage to the operating voltage increases with increase in operating voltage, and decreases with decreases in operating voltage, since by this means the frequency varying effects due to variation of collector current and voltage cancel each other.

The resistor 7, included in the emitter-collector circuit, may be effectively chosen to have such a value that a considerable part, preferably 20% to 40%, of the supply voltage drops across it. Thus also part of the supply voltage variation is prevented from appearing across the collector-emitter path. This also contributes to the stabilization of the oscillator frequency.

The required characteristic curve of the resistances of the base voltage divider may be obtained in a simple manner by replacing one of the resistors of the voltage divider by a variable resistor to determine the frequency shift with different values of the supply voltage and resistor values. The desired resistance characteristic curve is then duplicated without any difficulty by using a non-linear resistor in a series-combination or parallel-combination with ohmic resistors. Instead of using the series voltage divider 14, 15, 16 use may be made of a more complicated network, if this appears to be desirable. More particularly instead of the thermistor 16 use may be made of a thermistor with positive temperature coefficient which substitutes or is connected in series with resistor 14 respectively. This is indicated in FIG. 2 in the drawing.

What is claimed is:

1. A frequency stabilized transistor oscillator comprising a transistor having emitter, base and collector electrodes, a source of operating voltage having first and second terminals, means connecting said emitter and collector electrodes to said first and second terminals respectively, means for regeneratively interconnecting at least two of said electrodes to produce oscillations, a voltage divider having a tap, means connecting said voltage divider between said first and second terminals, and means connecting said base electrode to said tap, said voltage divider comprising non-linear resistor means connected to vary the ratio of emitter-base voltage to operating voltage in the same sense as variations in said operating voltage whereby the frequency of said oscillations is stabilized with variation of said operating voltage.

2. A frequency stabilized transistor oscillator comprising a transistor having emitter, base and collector electrodes, a source of operating voltage having first and second terminals, means connecting said emitter and collector electrodes to said first and second terminals respectively, voltage divider means having a tap, means connecting said voltage divider means between said first and second terminals, means connecting said base electrode to said tap, and means regeneratively connecting at least two of said electrodes to produce oscillations, said voltage divider means comprising means varying the emitter-base voltage of said transistor for increasing the ratio of emitter-base voltage to said operating voltage with increases in said operating voltage whereby the frequency of said oscillations is stabilized with variation in said operating voltage.

3. A frequency stabilized transistor oscillator comprising a transistor having emitter, base and collector electrodes, a source of operating voltage having first and second terminals, means connecting said emitter and collector electrodes to said first and second terminals respectively, voltage divider means comprising a series circuit of non-linear resistance means and ohmic resistance means, means connecting said series circuit between said first and second terminals, means connecting the junction of said non-linear resistance means and ohmic resistance means to said base electrode, and means regeneratively connecting at least two of said electrodes to produce oscillations, said non-linear resistance means being connected to vary the ratio of emitter-base voltage to operating voltage in the same sense as variations in said operating voltage, whereby the frequency of said oscillations is stabilized with variation of said operating voltage.

4. The oscillator of claim 3, in which the resistance of said non-linear resistance means varies in the opposite sense with respect to voltage thereacross, and means connecting said non-linear resistance means between said junction and second terminal.

5. The oscillator of claim 3, in which the resistance of said non-linear resistance means varies in the same sense with respect to voltage thereacross, and means connecting said non-linear resistance means between said junction and first terminal.

6. A frequency stabilized transistor oscillator comprising a transistor having emitter, base and collector electrodes, a source of operating voltage having first and second terminals, a resonant circuit having third and fourth terminals, means connecting said third terminal to said second terminal, first capacitor means connecting said fourth terminal to said collector electrode, second capacitor means connecting said fourth terminal to said emitter electrode to provide regenerative feedback, output circuit means connected between said collector electrode and second terminal, means connecting said emitter electrode to said first terminal, first and second resistor means connected serially in that order between said first and second terminals, and means connecting said base electrode to the junction of said first and second resistor means, said first resistor means being ohmic, said second resistor means comprising non-linear resistance means having a resistance that varies in the opposite sense with respect to voltage thereacross, whereby the frequency of said oscillations is stabilized with varying operating voltage.

7. The oscillator of claim 6, in which said means connecting said emitter to said first electrode comprises resistance means of sufficient value to drop from 20 to 40 percent of the operating voltage thereacross.

References Cited by the Examiner

UNITED STATES PATENTS

| | | | |
|---|---|---|---|
| 2,757,243 | 7/56 | Thomas | 331—109 X |
| 3,010,014 | 11/61 | Hiroshi Tanimura et al. | 325—451 |

ROY LAKE, *Primary Examiner.*

JOHN KOMINSKI, *Examiner.*